(12) United States Patent
Okazaki

(10) Patent No.: US 10,815,088 B2
(45) Date of Patent: Oct. 27, 2020

(54) MEDIUM PROCESSING APPARATUS AND CONTROL METHOD OF MEDIUM PROCESSING APPARATUS

(71) Applicant: SEIKO EPSON CORPORATION, Tokyo (JP)

(72) Inventor: Shinya Okazaki, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 125 days.

(21) Appl. No.: 16/269,629

(22) Filed: Feb. 7, 2019

(65) Prior Publication Data
US 2019/0248611 A1    Aug. 15, 2019

(30) Foreign Application Priority Data
Feb. 9, 2018  (JP) .................. 2018-021703

(51) Int. Cl.
| | |
|---|---|
| *B65H 7/12* | (2006.01) |
| *G01R 19/165* | (2006.01) |
| *G01N 29/44* | (2006.01) |
| *G01N 29/11* | (2006.01) |

(52) U.S. Cl.
CPC ............ *B65H 7/125* (2013.01); *G01N 29/11* (2013.01); *G01N 29/4427* (2013.01); *G01R 19/16528* (2013.01); *B65H 2511/524* (2013.01); *B65H 2553/30* (2013.01); *B65H 2557/24* (2013.01); *G01N 2291/015* (2013.01); *G01N 2291/0237* (2013.01); *G01N 2291/048* (2013.01)

(58) Field of Classification Search
CPC .... B65H 7/125; B65H 2553/30; G01N 29/11; G01N 29/4427; G01N 2291/048; G01N 2291/0237
See application file for complete search history.

(56) References Cited

U.S. PATENT DOCUMENTS

| | | | |
|---|---|---|---|
| 8,931,777 B2 * | 1/2015 | Okitsu .................. | B65H 7/125 271/262 |
| 2019/0389679 A1 * | 12/2019 | Hamada .................. | B65H 7/02 |

FOREIGN PATENT DOCUMENTS

JP    2013-075746 A    4/2013

* cited by examiner

*Primary Examiner* — Patrick Cicchino
(74) *Attorney, Agent, or Firm* — Global IP Counselors, LLP

(57) ABSTRACT

A medium processing apparatus includes: an ultrasonic oscillator; an ultrasonic sensor arranged at a position that opposes the ultrasonic oscillator interposing a transport path of a medium; an amplification circuit configured to amplify an output signal of the ultrasonic sensor; an integration circuit configured to integrate an output signal of the amplification circuit; a discharge circuit configured to perform discharge of an electric charge of a power storage circuit included in the integration circuit; and a determination circuit configured to determine whether or not multi-feed of the medium occurs on the basis of an output signal of the integration circuit, in which the discharge circuit stops, after performing discharge over a first period or more, the discharge, and after a second period has passed, the determination circuit performs a first (an initial) determination whether or not the multi-feed of the medium occurs.

12 Claims, 3 Drawing Sheets

MEDIUM PROCESSING APPARATUS AND CONTROL METHOD OF MEDIUM PROCESSING APPARATUS

This application claims priority under 35 U.S.C. § 119 to Japanese Patent Application No. 2018-21703 filed on Feb. 9, 2018, the entire disclosure of which is expressly incorporated by reference herein.

BACKGROUND

1. Technical Field

The present invention relates to a medium processing apparatus and a control method of the medium processing apparatus.

2. Related Art

A medium processing apparatus, such as a printer, a scanner, or the like, that processes a sheet shaped medium such as a printing paper sheet, an OHP resin film, a cut paper sheet such as a check, a name card, or the like includes an automatic transport device, such as a sheet feeder or the like, for automatically transporting a plurality of media one by one to a predetermined processing position. Such an automatic transport device generally includes a multi-feed determination mechanism for detecting that media are transported in an overlapped state, that is, multi-feed.

As an existing multi-feed determination mechanism, JP-A-2013-75746 discloses a multi-feed detecting device that judges, by measuring an attenuation of ultrasonic waves that penetrate through a transported medium, whether or not the medium is transported in an overlapped state. In order to prevent an erroneous detection of the multi-feed due to change over time of characteristics of an ultrasonic sensor, this multi-feed detecting device changes a threshold of a multi-feed determination with respect to output of the ultrasonic sensor on the basis of an output average value of the ultrasonic sensor.

In a multi-feed detection device using ultrasonic waves, generally speaking, since ultrasonic wave power that penetrates through the medium is small, a sensor signal output by the ultrasonic sensor is amplified by an amplifier up to approximately several tens of thousands times.

For example, when an amplifier amplifies a sensor signal, due to a minute noise signal, a determination error occurs in some cases.

For example, when the amplifier amplifies the sensor signal, an amplification circuit may shift to an oscillation state.

JP-A-2013-75746 described above does not describe or suggest the problem as described above. Additionally, there is also no effective instruction of a means for preventing such an erroneous operation.

SUMMARY

An advantage of some aspects of the invention is to achieve a stable and quick multi-feed determination in a medium processing apparatus.

According to an aspect of the invention, included are: an ultrasonic oscillator; an ultrasonic sensor arranged at a position that opposes the ultrasonic oscillator interposing a transport path of a medium having a sheet shape; an amplification circuit configured to amplify an output signal of the ultrasonic sensor; an integration circuit configured to integrate an output signal of the amplification circuit; a discharge circuit configured to perform discharge of an electric charge of a power storage circuit included in the integration circuit; and a determination circuit configured to determine whether or not multi-feed of the medium occurs on the basis of an output signal of the integration circuit, the discharge circuit stops, after performing discharge over a first period or more, the discharge, and after a second period has passed, the determination circuit performs a first determination whether or not the multi-feed of the medium occurs.

Additionally, it is preferable that the first period be a predetermined period in which the amplification circuit is predicted to reach an oscillation state, and the second period be a predetermined period until an output of the integration circuit converges.

According to this configuration, in a case where medium transport is stopped and the discharge of the power storage circuit is turned on over the predetermined period of time or more in which the amplification circuit is predicted to reach the oscillation state, after a predetermined period of time has passed from tuning the discharge off thereafter until the output of the integration circuit converges, the multi-feed determination is performed. In other words, the period of time until the oscillation state of the amplification circuit terminates after the discharge is turned off is evaluated as a period of time until the output of the integration circuit converges to a steady-state value, and the multi-feed determination is performed after the period of time has passed. With this, accuracy deterioration of the multi-feed determination at the medium transport caused by an unstable phenomenon in the medium transport pause period of the amplification circuit, which is a circuit of a multi-feed determination circuit, can be avoided, and a stable and quick multi-feed determination can be achieved.

It is preferable that the first period be a predetermined period in which the amplification circuit is predicted to reach an oscillation state, and the second period be a predetermined period in which the output signal of the integration circuit drops below a predetermined level.

According to this configuration, in a case where the medium transport is stopped and the discharge of the power storage circuit is turned on over the predetermined period of time or more in which the amplification circuit is predicted to reach the oscillation state, after the output of the integration circuit drops below the predetermined level from turning the discharge off thereafter, the multi-feed determination is performed. In other words, it is judged that the oscillation state of the amplification circuit terminates after the discharge is turned off by the output of the integration circuit dropping below the predetermined level, thereafter the multi-feed determination is performed. With this, by appropriately judging that the unstable phenomenon of the amplification circuit that occurs during the medium transport pause period terminates, accuracy deterioration of the multi-feed determination can be more reliably avoided, and a stable and quick multi-feed determination can be achieved.

Additionally, according to an aspect of the invention, it is preferable that the determination circuit perform, by repeating the discharge and stopping the discharge after performing the first determination, at least one succeeding determination whether or not the multi-feed of the medium occurs, and the determination circuit make, in comparison with a period from stopping the discharge until the first determination is performed immediately before the first determination, immediately before the succeeding determination immediately after the first determination, a period from stopping the discharge until the succeeding determination performed immediately after the stopping, short.

According to this configuration, after terminating the oscillation state of the amplification circuit which occurs during the medium transport pause period and performing a first multi-feed determination, by repeatedly performing the following multi-feed determination with a shorter interval, a multi-feed state on each position on the medium along a medium transport direction can be minutely judged.

Additionally, according to an aspect of the invention, it is preferable that the determination circuit perform, by repeating the discharge and stopping the discharge after performing the first determination, at least two succeeding determinations are performed whether or not the multi-feed of the medium occurs, and the determination circuit make, in comparison with a period from stopping the discharge until the first determination is performed immediately before the first determination, a time interval between at least the two succeeding determinations short.

According to this configuration, after terminating the oscillation state of the amplification circuit which occurs during the medium transport pause period and performing the first multi-feed determination, by repeatedly performing the following multi-feed determinations with a shorter interval, the multi-feed state on each position on the medium along the medium transport direction can be minutely judged.

Additionally, according to an aspect of the invention, it is preferable that the amplification circuit be configured of a plurality of amplifiers connected in multiple stages.

According to this configuration, the amplification circuit with high gain can be configured with ease.

Additionally, according to an aspect of the invention, a control method of a medium processing apparatus includes: an ultrasonic oscillator; an ultrasonic oscillation reception circuit arranged at a position that opposes the ultrasonic oscillator interposing a transport path of a medium having a sheet shape; an amplification circuit configured to amplify an output signal of the ultrasonic oscillation reception circuit; an integration circuit configured to integrate an output signal of the amplification circuit; and a discharge circuit configured to perform discharge of an electric charge of a power storage circuit included in the integration circuit, in which the discharge circuit stops, after performing discharge over a first period or more, the discharge, and after a second period has passed, a first determination whether or not multi-feed of the medium occurs is performed.

It is preferable that the first period be a predetermined period in which the amplification circuit is predicted to reach an oscillation state, and the second period be a predetermined period in which an output of the integration circuit converges.

According to this configuration, the period of time until the oscillation state of the amplification circuit terminates after the discharge is turned off is evaluated as a period of time until the output of the integration circuit converges to a steady-state value, and the multi-feed determination is performed after the period of time has passed. With this, accuracy deterioration of the multi-feed determination at the medium transport caused by an unstable phenomenon of the amplification circuit that occurs during the medium transport pause period can be avoided, and a stable and quick multi-feed determination can be achieved.

It is preferable that the first period be a predetermined period in which the amplification circuit is predicted to reach an oscillation state, and the second period be a predetermined period in which the output signal of the integration circuit drops below a predetermined level.

According to this configuration, after the output of the integration circuit drops below the predetermined level from turning the discharge off, the multi-feed determination is performed. In other words, it is judged that the oscillation state of the amplification circuit terminates after the discharge is turned off by the output of the integration circuit dropping below the predetermined level, thereafter the multi-feed determination is performed. With this, by appropriately judging that the unstable phenomenon of the amplification circuit that occurs during the medium transport pause period terminates, accuracy deterioration of the multi-feed determination can be more reliably avoided, and a stable and quick multi-feed determination can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
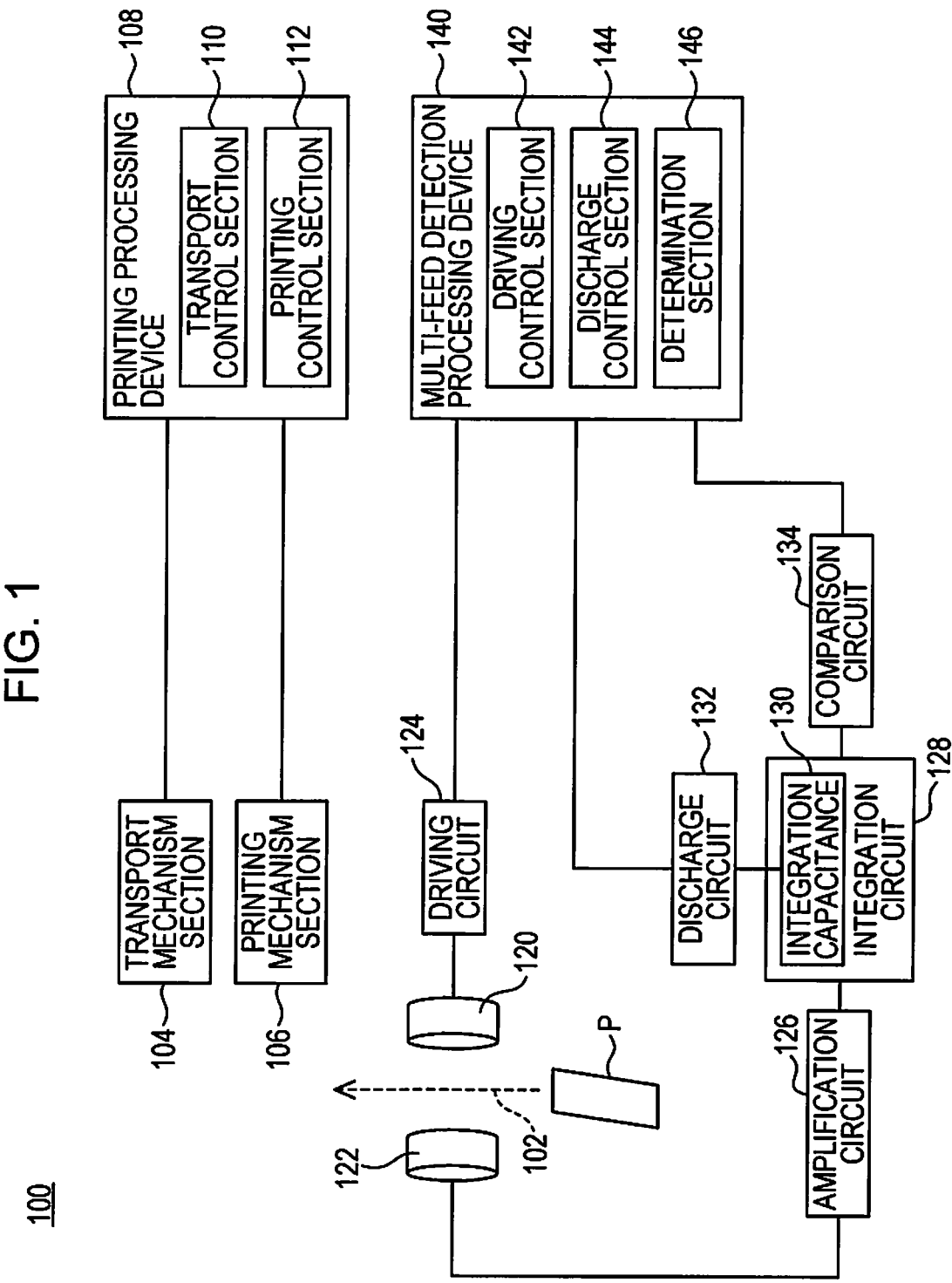
FIG. 1 is a diagram illustrating a configuration of a medium processing apparatus according to an embodiment of the invention.

FIG. 1 is a diagram illustrating a configuration of a medium processing apparatus 100 according to an embodiment of the invention. The medium processing apparatus 100 is a printer including an auto sheet feeder that transports a paper sheet P that is a sheet shaped medium in the embodiment. Note that the medium processing apparatus 100 is not limited thereto, can be any apparatus that includes an auto sheet feeder for transporting a sheet shaped medium one by one, and performs some processing on the above medium. For example, the medium processing apparatus 100 may be a scanner including the auto sheet feeder for transporting a sheet shaped medium such as a check, a leaflet, or the like. Additionally, the medium processing apparatus 100 can be a composite apparatus including such a printer and a scanner together.

The medium processing apparatus 100 being a printer includes a transport mechanism section 104 (transport mechanism) that moves the paper sheet P being a sheet shaped medium on a transport path 102, and a printing mechanism section 106 (printing mechanism) that performs printing on the transported paper sheet P with a head that discharges ink, for example. Additionally, the medium processing apparatus 100 includes a printing processing device 108. The paper sheet P is taken out from a paper sheet tray (not illustrated) that stores a plurality of the paper sheets P one by one by the transport mechanism section 104, and transported along the transport path 102.

The printing processing device 108 is a computer including a processor such as a CPU (Central Processing Unit) or the like. The printing processing device 108 may have a configuration including a ROM (Read Only Memory) in which a program is written, a RAM (Random Access Memory) for temporarily storing data, and the like. Additionally, the printing processing device 108 includes, as functional elements (or functional units), a transport control section 110 that controls transport of the paper sheet P by instructing the transport mechanism section 104, and a printing control section 112 (printing control board, printing control circuit) that performs printing on the paper sheet P by instructing the printing mechanism section 106.

These functional elements included in the printing processing device 108 are achieved, for example, by the printing processing device 108 that is the computer by reading the program from the ROM and executing it. Note that the above computer program can be stored in any computer-readable storage medium.

Instead of the above configuration, all or some of the above functional elements included in the printing processing device 108 each can also be configured of hardware including one or more electronic circuit components (electronic circuit boards). The hardware as described above can include a logic circuit (logic circuit board) such as a DSP (Digital Signal Processor), an FPGA (Field Programmable Gate Array), or the like, or programmed hardware.

The medium processing apparatus 100 additionally includes an ultrasonic transmitter 120 that is an ultrasonic oscillator (ultrasonic oscillation device, ultrasonic oscillation circuit, ultrasonic oscillation circuit board, ultrasonic transmission portion) arranged in the vicinity of the transport path 102, and an ultrasonic sensor 122 that is an ultrasonic oscillation receiver (ultrasonic oscillation reception circuit, ultrasonic oscillation reception circuit board, ultrasonic reception portion) arranged at a position that opposes the ultrasonic transmitter 120 with the transport path 102 interposed therebetween. The ultrasonic sensor 122 receives ultrasonic waves, which penetrate through the paper sheet P on the transport path 102, generated by the ultrasonic transmitter 120. Additionally, the medium processing apparatus 100 includes a driving circuit (driving circuit board) 124 that drives the ultrasonic transmitter 120 to generate the ultrasonic waves, and an amplification circuit (amplification circuit board) 126 that amplifies a sensor signal being an output signal of the ultrasonic sensor 122. The amplification circuit 126 requires high gain of approximately hundred thousand times, for example, and is thus configured by a plurality of amplifiers connected in multiple stages.

The medium processing apparatus 100 additionally includes an integration circuit (integration circuit board) 128 that integrates an output signal of the amplification circuit 126, and a discharge circuit (discharge circuit board) 132 that performs discharge of a power storage circuit (integration capacitance section, integration capacitance circuit, integration capacitance circuit board) 130 included in the integration circuit 128. The integration circuit 128 is configured of an Operational Amplifier, for example, and includes a capacitor as the integration capacitance section 130 in a feedback circuit portion (feedback circuit, feedback circuit board) connecting an output portion (output circuit, output circuit board) and an input portion (input circuit, input circuit board) thereof. The discharge circuit 132 is, for example, configured of a semiconductor switch for turning a short-circuit path between terminals of the capacitor being the integration capacitance section 130 on/off. The semiconductor switch as described above can be configured of a MOS-FET (Metal-Oxide-Semiconductor Field-Effect Transistor), for example.

Additionally, the medium processing apparatus 100 includes a comparison circuit (comparison circuit board) 134 that compares an output voltage of the integration circuit 128 with a predetermined threshold voltage. The above threshold voltage is provided as a reference voltage of the comparison circuit 134 as a predetermined voltage, which is determined in advance, for judging whether or not a plurality of the paper sheets P is transported in an overlapped state, that is, whether or not multi-feed of the paper sheet P occurs. The comparison circuit 134 compares the output voltage of the integration circuit 128 with the reference voltage being the above threshold voltage, and outputs a binary signal indicating a comparison result.

Here, an electronic circuit (electronic circuit board) including the amplification circuit 126, the integration circuit 128, and the discharge circuit 132 configures a multi-feed determination circuit as a whole.

The medium processing apparatus 100 further includes a multi-feed detection processing device 140. The multi-feed detection processing device 140 is a computer including a processor such as a CPU or the like. The multi-feed detection processing device 140 may have a configuration including a ROM in which a program is written, a RAM for temporarily storing data, and the like. Additionally, the multi-feed detection processing device 140 includes, as functional elements (or functional units), a driving control section 142 (driving control circuit, driving control circuit board), a discharge control section 144 (discharge control circuit, discharge control circuit board), and a determination section 146 (determination circuit, determination circuit board).

These functional elements included in the multi-feed detection processing device 140 are achieved, for example, by the multi-feed detection processing device 140 that is the computer by reading the program from the ROM and executing it. Note that the above computer program can be stored in any computer-readable storage medium.

Instead of the above configuration, all or some of the above functional elements included in the multi-feed detection processing device 140 each can also be configured of hardware including one or more electronic circuit components (electronic circuit boards). The hardware as described above can include a logic circuit (IC) such as a DSP, an FPGA, or the like, or programmed hardware.

The multi-feed detection processing device 140 acquires transport state information and medium position information from the printing processing device 108 and performs multi-feed detection. The transport state information is information of a transport state indicating whether or not transport of the paper sheet P is started on the transport path 102, whether or not the transport is being executed, and the like. Additionally, the medium position information is information indicating a position, on the transport path 102, of the paper sheet P that is transported on the transport path 102. The printing processing device 108 generates the medium position information, for example, on the basis of information from sensors (not illustrated) arranged on the transport path 102 in a distributed manner.

In accordance with an instruction of the determination section 146, the driving control section 142 drives the ultrasonic transmitter 120 when the paper sheet P is transported, and causes the ultrasonic transmitter 120 to generate a ultrasonic pulse with a length of a predetermined period of time Ton. Here, Ton is defined on the basis of necessary or sufficient period of time for the output voltage of the integration circuit 128 increasing, to an extent that the comparison circuit 134 can effectively determine a multi-feed state.

In accordance with an instruction from the determination section 146, the discharge control section 144 turns the discharge circuit 132 on/off to control an electric charge accumulation operation in the integration capacitance section 130, and turns an integration operation of the integration circuit 128 on/off. On the basis of the transport state information, when the paper sheet P is not transported, the discharge control section 144 turns the discharge circuit 132 on so that the electric charge is not accumulated in the integration capacitance section 130, and turns the integration operation of the integration circuit 128 off. Additionally, on the basis of the instruction of the determination section 146, when the determination section 146 performs the multi-feed determination, the discharge control section 144 turns the discharge circuit 132 off so that the electric charge can be accumulated in the integration capacitance section 130, and causes the integration circuit 128 to perform the integration operation. With this, the integration circuit 128 outputs an output voltage obtained by integrating the amplified sensor signal output from the amplification circuit 126 to the comparison circuit 134. The comparison circuit 134 compares this output voltage with the threshold voltage, and outputs a binary signal (hereinafter, referred to as a determination signal) indicating a determination result whether or not to be in the multi-feed state to the multi-feed detection processing device 140.

On the basis of the transport state information, the determination section 146 acquires the determination signal from the comparison circuit 134 at a predetermined timing, and performs the final multi-feed determination whether or not to be in the multi-feed state.

Here, a circuit portion configured of the amplification circuit 126, the integration circuit 128, and the discharge circuit 132 is designed so as to stably operate at least in a state in which the discharge of the integration capacitance section 130 is turned off by the discharge circuit 132 and the integration circuit 128 is performing the original integration operation. However, by turning the discharge of the integration capacitance section 130 on/off, input impedance of the integration circuit 128 viewed from the amplification circuit 126 largely fluctuates, and as a result, load impedance of the amplification circuit 126 largely fluctuates. Accordingly, generally speaking, when the discharge of the integration capacitance section 130 is turned on, the amplification circuit 126 having the high gain of approximately hundred thousand times shifts to an oscillation state with a certain time constant in some cases. As a result, in the existing technique, caused by the oscillation in a period in which the discharge is turned on, in the multi-feed determination which is performed thereafter while turning the discharge off, an erroneous determination may arise.

In order to prevent this, in the medium processing apparatus 100 according to the embodiment, after turning the discharge of the integration capacitance section 130 on by the discharge circuit 132 over a predetermined period of time or more in which the amplification circuit 126 is predicted to reach the oscillation state, the determination section 146 performs the multi-feed determination as described below. In other words, after turning the discharge of the integration capacitance section 130 off and starting the integration operation of the integration circuit 128, the determination section 146 stands by until a predetermined period of time in which the output of the integration circuit converges passes. Then, after the above predetermined period of time has passed, on the basis of the output signal of the integration circuit 128, a first determination whether or not the multi-feed of the medium occurs is performed.

Figure 2:
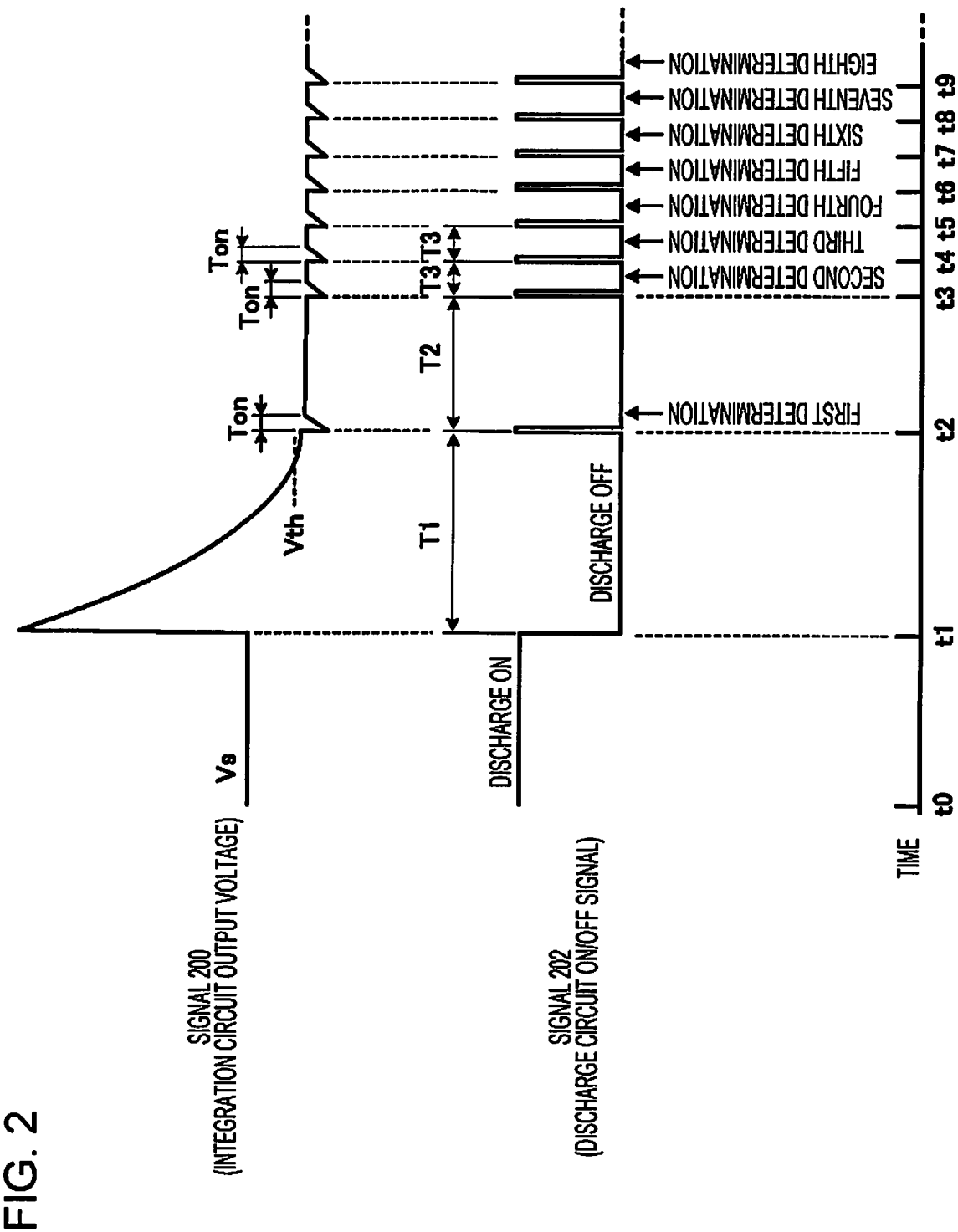
FIG. 2 is a timing chart illustrating an example of a multi-feed determination.

Next, while referring to FIG. 1, using a timing chart illustrated in FIG. 2, an operation of the multi-feed detection processing device 140 will be further described. FIG. 2 is the timing chart illustrating an example of the multi-feed determination. A signal 200 illustrated in an upper portion in FIG. 2 indicates a temporal change of the output voltage of the integration circuit 128. Additionally, a signal 202 illustrated in a middle portion in FIG. 2 indicates a temporal change of a binary signal, which is output by the multi-feed detection processing device 140 to the discharge circuit 132, for indicating ON/OFF of the discharge of the integration capacitance section 130. Note that in the signal 202, a high indicates the discharge ON state, and a low indicates the discharge OFF state. Additionally, a lower portion illustrated in the drawing indicates time. Here, generation of the ultrasonic waves by the ultrasonic transmitter 120 and the discharge of on/off of the integration capacitance section 130 by the discharge circuit 132 are each performed by the determination section 146 instructing the driving control section 142 and the discharge control section 144.

At a time t0, because of the transport of the paper sheet P being not performed or the like, the discharge circuit 132 is in a discharge ON state in a relatively long period of time, and the amplification circuit 126 is in the oscillation state. At this time, the output voltage of the integration circuit 128 (signal 200) is a certain voltage value Vs, for example, by a DC resistance of a semiconductor switch acting as a feedback resistance as the discharge circuit 132 that short-circuits the terminals of the integration capacitance section 130.

Thereafter, when the transport of the paper sheet P is started, by the discharge control section 144, in order to start the multi-feed determination, at a time t1, the discharge circuit 132 is turned off. With this, a large output from the amplification circuit 126 in the oscillation state is integrated by the integration circuit 128, and the output voltage of the integration circuit 128 steeply increases. Thereafter, caused by the discharge circuit 132 being turned on, the oscillation state of the amplification circuit 126 gradually terminates, and the output voltage of the integration circuit 128 decreases with a certain time constant. With this, the output voltage of the integration circuit 128 exhibits a peak immediately after the time t1.

Then, at a time t2 after a predetermined period of time T1 has passed from the discharge circuit 132 turning the discharge of the integration capacitance section 130 off at the time t1 until the output voltage of the integration circuit 128 decreases and converges to a steady state, the determination section 146 turns the discharge circuit 132 on (signal 202). The determination section 146 maintains the on state of the discharge circuit 132 only for a short period of time necessary for performing the discharge of the integration capacitance section 130 and resetting the output voltage of the integration circuit 128, and then immediately turns the discharge circuit 132 off. With this, the output voltage of the integration circuit 128 (signal 200) rapidly decreases at the time t2.

Simultaneously, the determination section 146 instructs the driving control section 142 at the time t2 to cause the ultrasonic transmitter 120 to generate the ultrasonic waves only during the period of time Ton. With this, in the integration circuit 128, the amplified sensor signal from the amplification circuit 126, which is necessary for the multi-feed determination, is integrated, the output voltage of the integration circuit 128 gradually increases (see the signal 200 in the period of time Ton after the time t2).

Then, the determination section 146 turns the discharge circuit 132 off, for example, immediately after a time at which the generation of the ultrasonic waves of the ultrasonic transmitter 120 is stopped and the output voltage of the integration circuit 128 reaches a constant value (that is, time t2+Ton), and acquires the determination signal from the comparison circuit 134. Then, the determination section 146 performs the final multi-feed determination with the determination signal acquired from the comparison circuit 134. This multi-feed determination corresponds to the first determination that is performed on the basis of the output of the integration circuit 128 after the discharge of the integration capacitance section 130 is turned on over the predetermined period of time or more in which the amplification circuit 126 is predicted to reach the oscillation state because of the transport of the paper sheet P being stopped or the like.

Subsequently, the determination section 146 starts an operation for a second multi-feed determination which is a succeeding multi-feed determination subsequent to the first multi-feed determination at a time t3 after a predetermined period of time T2 has passed from the time t2, and after the time t3+Ton, performs the second multi-feed determination. Thereafter, the determination section 146 repeatedly performs the succeeding multi-feed determinations with a time interval of a predetermined period of time T3. This succeeding multi-feed determination ends, for example, when a terminal end portion (a rear end portion in a direction along the transport direction) of the paper sheet P passes through a gap between the ultrasonic transmitter 120 and the ultrasonic sensor 122. Note that in FIG. 2, although by performing the succeeding multi-feed determinations subsequent to the first multi-feed determination seven times, the multi-feed determinations are performed eight times, the number of the succeeding multi-feed determinations is not limited thereto.

Here, in FIG. 2, a period of time from turning the discharge of the integration capacitance section 130 off immediately before the first determination until performing the first determination is T1+Ton. Additionally, a period of time from turning the above discharge off immediately before the succeeding determination (that is, the second determination) immediately after the first determination until performing the above succeeding determination is T2+Ton. Additionally, the time interval between at least two succeeding determinations is T3.

Then, the determination section 146 sets T2+Ton to be shorter than T1+Ton. With this configuration, after terminating the oscillation state of the amplification circuit 126 which occurs during a pause period of the transport of the paper sheet P and performing the first multi-feed determination, by repeatedly performing the multi-feed determination with a shorter interval, the multi-feed state on each position on the paper sheet P can be minutely judged.

Additionally, the determination section 146 sets T3 to be shorter than T1+Ton. With this configuration, after terminating the oscillation state of the amplification circuit 126 which occurs during the pause period of the medium transport and performing the first multi-feed determination, by repeatedly performing the multi-feed determinations with a shorter interval, the multi-feed state on each position of the paper sheet P in the transport path 102 along the transport direction can be minutely judged.

Note that in the example in FIG. 2, in a case where the discharge of the integration capacitance section 130 is turned on during a long period enough to estimate that the amplification circuit 126 reaches the oscillation state, the determination section 146 performs the multi-feed determination after the predetermined period of time T1 after turning the above discharge off until the output of the integration circuit 128 converges has passed. Note that the timing of the first multi-feed determination is not limited thereto. Instead of or in addition to this, after turning the above discharge off, the determination section 146 may perform the first multi-feed determination, for example, after judging that the oscillation state of the amplification circuit 126 ends by the output signal of the integration circuit 128 dropping below a predetermined level (Vth illustrate in FIG. 2).

Figure 3:
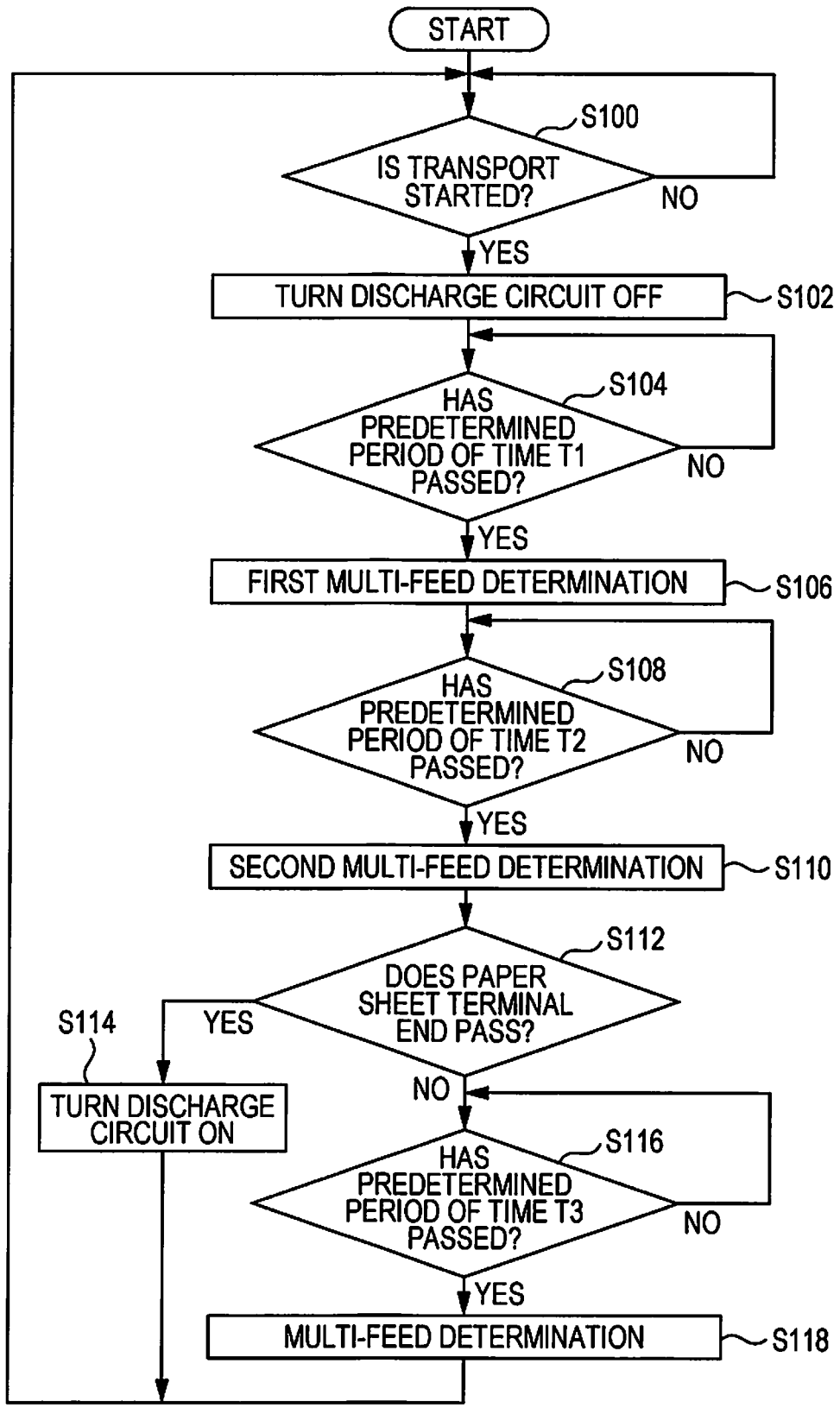
FIG. 3 is a flowchart illustrating an operation procedure of the multi-feed determination.

Next, while referring to FIG. 1, using a flowchart illustrated in FIG. 3, an operation procedure of the multi-feed determination in the medium processing apparatus 100 will be described. This operation starts when a power source of the medium processing apparatus 100 is turned on, and ends when the power source is turned off.

When the operation is started, first, the determination section 146 acquires the transport state information from the printing processing device 108, and judges whether or not the transport of the paper sheet P from the paper sheet tray by the transport mechanism section 104 is started (S100). In a case where the transport is not started (NO at S100), the determination section returns to step S100 and stands by until the transport is started.

On the other hand, in a case where the transport of the paper sheet P is started (YES at S100), the determination section 146 instructs the discharge control section 144 to turn the discharge circuit 132 off to turn the discharge of the integration capacitance section 130 off (S102). Subsequently, the determination section 146 judges whether or not the predetermined period of time T1 has passed after the discharge circuit 132 is turned off (S104). This judgement can be, for example, performed using a timer (not illustrated) included in the multi-feed detection processing device 140.

Then, in a case where the predetermined period of time T1 has not passed (NO at S104), the determination section returns to step S104 and stands by until the predetermined period of time T1 passes. On the other hand, in a case where the predetermined period of time T1 has passed (YES at S104), the determination section 146 performs the first multi-feed determination (S106). This multi-feed determination is performed, as described above, by the determination section 146, first, turning the discharge circuit 132 on once to cause the integration capacitance section 130 to perform the discharge, and then immediately tuning the discharge circuit 132 off and causing the ultrasonic transmitter 120 to generate the ultrasonic waves over the period of time Ton. The determination section 146 acquires, for example, after the period of time of T1+Ton has passed, the determination signal from the comparison circuit 134 and can perform the first determination.

Subsequently, the determination section 146 judges whether or not the predetermined period of time T2 has passed from a switching time of the discharge circuit 132 to the on state immediately before the first determination (S108). Then, in a case where the predetermined period of time T2 has not passed (NO at S108), the determination section returns to step S108 and stands by until the predetermined period of time T2 passes. On the other hand, in a case where the predetermined period of time T2 has passed (YES at S108), the determination section 146 performs the second multi-feed determination being the succeeding determination (S110).

Next, the determination section 146 acquires the medium position information from the printing processing device 108, and judges whether or not the terminal end of the paper sheet P being the medium passes in front of the ultrasonic sensor 122, for example (S112). In a case where the terminal end passes (YES at S112), the determination section 146 instructs the discharge control section 144 to turn the discharge circuit 132 on to turn the discharge of the integration capacitance section 130 on (S114). Thereafter, the determination section 146 returns to step S100 and repeats processing.

On the other hand, in a case where the terminal end of the paper sheet P does not pass in front of the ultrasonic sensor 122 (NO at S112), the determination section 146 judges whether or not the predetermined period of time T3 from the time of switching of the discharge circuit 132 to the on state that is performed immediately before the last succeeding determination has passed (S116). Then, in a case where the predetermined period of time T3 has not passed (NO at S116), the determination section returns to step S116 and stands by until the predetermined period of time T3 passes. On the other hand, in a case where the predetermined period of time T3 has passed (YES at S116), the determination section 146 performs a next succeeding multi-feed determination (S118), then returns to step S100 and repeats processing.

As described above, the medium processing apparatus 100 according to the invention or the medium processing apparatus 100 that carries out the multi-feed determination method according to the invention includes the ultrasonic transmitter 120 that is the ultrasonic transmission portion. Additionally, the medium processing apparatus 100 includes the ultrasonic sensor 122 that is the ultrasonic reception portion arranged at a position that opposes the ultrasonic transmitter 120 with the transport path 102 of the paper sheet P being the sheet shaped medium interposed therebetween. Additionally, the medium processing apparatus 100 includes the amplification circuit 126 that amplifies the output signal of the ultrasonic sensor 122, the integration circuit 128 that integrates the output signal of the amplification circuit 126, and the discharge circuit 132 that performs the discharge of the integration capacitance section 130 of the integration circuit 128. Additionally, the medium processing apparatus 100 includes the determination section 146 that determines whether or not the multi-feed of the paper sheet P occurs on the basis of the output signal of the integration circuit 128. The determination section 146 controls the discharge circuit 132 to control on and off of the discharge of the integration capacitance section 130. Additionally, in a case where the above discharge is turned on over the predetermined period of time or more in which the amplification circuit 126 is predicted to reach the oscillation state, the determination section 146 judges whether or not the predetermined period of time T1 from turning the above discharge off until the output of the integration circuit 128 converges has passed. Then, after the predetermined period of time T1 has passed, on the basis of the output signal of the integration circuit 128, the first determination whether or not the multi-feed of the paper sheet P occurs is performed.

According to this configuration, in a case where the discharge of the integration capacitance section 130 is turned on over the predetermined period of time or more in which the amplification circuit 126 is predicted to reach the oscillation state, passage of the predetermined period of time T1 from turning the discharge off thereafter until the output of the integration circuit 128 converges is waited. Then, after the predetermined period of time T1 has passed, the first multi-feed determination is performed. In other words, the period of time until the oscillation state of the amplification circuit 126 terminates after the discharge is turned off is evaluated as a period of time until the output of the integration circuit 128 converges to a steady-state value, and the first multi-feed determination is performed after the period of time has passed. With this, accuracy deterioration of the multi-feed determination at medium transport caused by an unstable phenomenon in the medium transport pause period of the amplification circuit 126, which is a part of the multi-feed determination circuit, can be avoided, and a stable and quick multi-feed determination can be achieved.

Additionally, in the medium processing apparatus 100 according to the invention, in a case where the discharge of the integration capacitance section 130 is turned on over the predetermined period of time or more in which the amplification circuit 126 is predicted to reach the oscillation state, after turning the above discharge off, the determination section 146 monitors the output signal of the integration circuit 128. Then, after judging that the oscillation state of the amplification circuit 126 ends by the output signal of the integration circuit 128 dropping below the predetermined level Vth, the first determination whether or not the multi-feed of the paper sheet P occurs is performed on the basis of the output signal of the integration circuit 128.

According to this configuration, it is judged that the oscillation state of the amplification circuit 126 terminates after the discharge is turned off by the output of the integration circuit 128 dropping below the predetermined level, thereafter the multi-feed determination is performed. With this, by appropriately judging that the unstable phenomenon of the amplification circuit 126 that occurs during the medium transport pause period terminates, accuracy deterioration of the multi-feed determination can be more reliably avoided, and a stable and quick multi-feed determination can be achieved.

Additionally, in the medium processing apparatus 100 according to the invention, the determination section 146 performs, after performing the first determination, while repeatedly turning the above discharge on and off, at least one succeeding determination whether or not the multi-feed of the paper sheet P occurs. Additionally, the determination section 146 sets the period of time from turning the above discharge off immediately before the succeeding determination immediately after the above first determination until the above succeeding determination being immediately after is performed to be shorter than the period of time from turning the above discharge off immediately before the above first determination until the above first determination is performed. According to this configuration, after terminating the oscillation state of the amplification circuit 126 which occurs during the pause period of the transport of the paper sheet P and performing the first multi-feed determination, by repeatedly performing the multi-feed determinations with a shorter interval, the multi-feed state on each position on the paper sheet P can be minutely judged.

Additionally, in the medium processing apparatus 100 according to the invention, the determination section 146 performs, after performing the above first determination, while repeatedly turning the above discharge on and off, at least two succeeding determinations whether or not the multi-feed of the paper sheet P occurs. Additionally, the determination section 146 sets the predetermined period of time T3 that is the time interval between the above at least two succeeding determinations to be shorter than the predetermined period of time T1 from tuning the above discharge off immediately before the above first determination until the above first determination is performed. According to this configuration, after terminating the oscillation state of the amplification circuit 126 which occurs during the transport pause period of the paper sheet P and performing the first multi-feed determination, by repeatedly performing the multi-feed determinations with a shorter interval, the multi-feed state on each position on the paper sheet P can be minutely judged.

Additionally, in the medium processing apparatus 100 according to the invention, the amplification circuit 126 is configured of a plurality of amplifiers connected in multiple stages. According to this configuration, the amplification circuit 126 with high gain can be configured with ease.

Note that the invention is not limited to the configuration of the above embodiment, the invention can be carried out in various forms without departing from the scope thereof.

For example, in the above embodiment, although the medium processing apparatus 100 includes the printing processing device 108 and the multi-feed detection processing device 140 as individual devices configured of individual CPUs, the configuration is not limited thereto. For example, the printing processing device 108 and the multi-feed detection processing device 140 may be configured as one processing device including one or a plurality of CPUs.

Additionally, in the above embodiment, although the output voltage of the integration circuit 128 and the threshold voltage are compared with each other by the comparison circuit 134 and the determination signal as the comparison result is output, the configuration is not limited thereto. For example, instead of the comparison circuit 134, an analog-digital converter (a circuit that converts an analog signal to a digital signal) may be provided, and by directly comparing the output voltage of the integration circuit 128 that is converted to a digital value and the threshold voltage expressed by a digital value with each other in the determination section 146, the multi-feed determination may be performed.

What is claimed is:

1. A medium processing apparatus comprising:
an ultrasonic oscillator;
an ultrasonic sensor arranged at a position that opposes the ultrasonic oscillator interposing a transport path of a medium having a sheet shape;
an amplification circuit configured to amplify an output signal of the ultrasonic sensor;
an integration circuit configured to integrate an output signal of the amplification circuit;
a discharge circuit configured to perform discharge of an electric charge of a power storage circuit included in the integration circuit; and
a determination circuit configured to determine whether or not multi-feed of the medium occurs on the basis of an output signal of the integration circuit,
wherein the discharge circuit stops, after performing discharge over a first period or more, the discharge, and after a second period has passed, the determination circuit performs a first determination whether or not the multi-feed of the medium occurs.

2. The medium processing apparatus according to claim 1, wherein the first period is a predetermined period in which the amplification circuit is predicted to reach an oscillation state, and the second period is a predetermined period until an output of the integration circuit converges.

3. The medium processing apparatus according to claim 1, wherein the first period is a predetermined period in which the amplification circuit is predicted to reach an oscillation state, and the second period is a predetermined period in which the output signal of the integration circuit drops below a predetermined level.

4. The medium processing apparatus according to claim 1, wherein the determination circuit performs, by repeating the discharge and stopping the discharge after performing the first determination, at least one succeeding determination whether or not the multi-feed of the medium occurs, and
the determination circuit makes, in comparison with a period from stopping the discharge until the first determination is performed, a period from stopping the discharge until the succeeding determination is performed short.

5. The medium processing apparatus according to claim 1, wherein the determination circuit performs, by repeating the discharge and stopping the discharge after performing the first determination, at least two succeeding determinations whether or not the multi-feed of the medium occurs, and
the determination circuit makes, in comparison with a period from stopping the discharge until the first determination is performed, a period between at least the two succeeding determinations short.

6. The medium processing apparatus according to claim 1, wherein the amplification circuit is configured of a plurality of amplifiers connected in multiple stages.

7. A control method of a medium processing apparatus comprising:
an ultrasonic oscillator;
an ultrasonic sensor arranged at a position that opposes the ultrasonic oscillator interposing a transport path of a medium having a sheet shape;
an amplification circuit configured to amplify an output signal of the ultrasonic sensor;
an integration circuit configured to integrate an output signal of the amplification circuit; and
a discharge circuit configured to perform discharge of an electric charge of a power storage circuit included in the integration circuit,
wherein the discharge circuit stops, after performing discharge over a first period or more, the discharge, and after a second period has passed, a first determination whether or not multi-feed of the medium occurs is performed.

8. The control method of the medium processing apparatus according to claim 7,
wherein the first period is a predetermined period in which the amplification circuit is predicted to reach an oscillation state, and the second period is a predetermined period in which an output of the integration circuit converges.

9. The control method of the medium processing apparatus according to claim 7,
wherein the first period is a predetermined period in which the amplification circuit is predicted to reach an oscillation state, and
the second period is a predetermined period in which the output signal of the integration circuit drops below a predetermined level.

10. The control method of the medium processing apparatus according to claim 7, including
performing, by repeating the discharge and stopping the discharge after performing the first determination, at least one succeeding determination whether or not the multi-feed of the medium occurs, and
making, in comparison with a period from stopping the discharge until the first determination is performed, a period from stopping the discharge until the one succeeding determination is performed short.

11. The control method of the medium processing apparatus according to claim 7, including performing, by repeating the discharge and stopping the discharge after performing the first determination, at least two succeeding determinations whether or not the multi-feed of the medium occurs, and making, in comparison with a period from stopping the discharge until the first determination is performed, a period between at least the two succeeding determinations short.

12. The control method of the medium processing apparatus according to claim 7, wherein amplification of the amplification circuit is performed in multiple stages.

\* \* \* \* \*